United States Patent
Kosho

(10) Patent No.: US 11,837,450 B2
(45) Date of Patent: Dec. 5, 2023

(54) SPUTTERING TARGET FOR MAGNETIC RECORDING MEDIUM, AND MAGNETIC THIN FILM

(71) Applicant: JX Nippon Mining & Metals Corporation, Tokyo (JP)

(72) Inventor: Takashi Kosho, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 1043 days.

(21) Appl. No.: 16/077,663

(22) PCT Filed: Jan. 4, 2017

(86) PCT No.: PCT/JP2017/000022
§ 371 (c)(1),
(2) Date: Aug. 13, 2018

(87) PCT Pub. No.: WO2017/141558
PCT Pub. Date: Aug. 24, 2017

(65) Prior Publication Data
US 2019/0040517 A1    Feb. 7, 2019

(30) Foreign Application Priority Data
Feb. 19, 2016    (JP) .................................. 2016-030489

(51) Int. Cl.
*H01J 37/34* (2006.01)
*C23C 14/34* (2006.01)
(Continued)

(52) U.S. Cl.
CPC .......... *H01J 37/3429* (2013.01); *C23C 14/06* (2013.01); *C23C 14/3414* (2013.01);
(Continued)

(58) Field of Classification Search
CPC ............. H01J 37/3426; H01J 37/3429; C23C 14/3414; C23C 14/06; C04B 2235/3201;
(Continued)

(56) References Cited

U.S. PATENT DOCUMENTS 9,095,901 B2    8/2015    Miyashita et al.
9,328,412 B2    5/2016    Ogino et al.
(Continued)

FOREIGN PATENT DOCUMENTS

CN    101372038 A    2/2009
EP    1895518 A1 *    3/2008    ......... C23C 14/3414
(Continued)

OTHER PUBLICATIONS

Derwent Abstract WO 2014/132746 (Year: 2014).*
(Continued)

*Primary Examiner* — Michael A Band
(74) *Attorney, Agent, or Firm* — HOWSON & HOWSON LLP

(57) ABSTRACT

Provided is a sputtering target or a film which is characterized by containing 0.1 to 10 mol % of an oxide of one or more types selected from FeO, $Fe_3O_4$, $K_2O$, $Na_2O$, PbO, and ZnO, 5 to 70 mol % of Pt, and the remainder being Fe. The present invention addresses the issue of providing a sputtering target capable of considerably reducing the particles caused by nonmagnetic materials and significantly improving the yield during deposition. It is thereby possible to deposit a quality magnetic recording layer and improve yield of a magnetic recording medium.

4 Claims, 1 Drawing Sheet

(51) Int. Cl.
- *G11B 5/65* (2006.01)
- *G11B 5/851* (2006.01)
- *H01F 10/14* (2006.01)
- *H01F 41/18* (2006.01)
- *C23C 14/06* (2006.01)

(52) U.S. Cl.
CPC ............... *G11B 5/65* (2013.01); *H01F 10/14* (2013.01); *C23C 14/34* (2013.01); *G11B 5/851* (2013.01); *H01F 41/18* (2013.01)

(58) Field of Classification Search
CPC .... C04B 2235/3203; C04B 2235/3272; C04B 2235/3284; C04B 2235/3296; C04B 14/30; C04B 14/308; C04B 35/453; C04B 35/497; C04B 41/5049; C22C 5/04; C22C 29/12; C22C 32/0021; C22C 45/003; C22C 45/02; C22C 35/002; C22C 32/00; G11B 5/65; G11B 5/851; H01F 10/14; H01F 41/18

See application file for complete search history.

(56) References Cited

U.S. PATENT DOCUMENTS

| | | | |
|---|---|---|---|
| 9,567,665 | B2 | 2/2017 | Takami et al. |
| 10,186,404 | B2 * | 1/2019 | Goto ................ G11B 5/653 |
| 2009/0053089 | A1 | 2/2009 | Yang et al. |
| 2011/0284373 | A1 * | 11/2011 | Sato ................ G11B 5/851 |
| | | | 204/298.13 |
| 2013/0168240 | A1 * | 7/2013 | Ogino ................ H01J 37/3429 |
| | | | 204/298.13 |
| 2013/0206591 | A1 | 8/2013 | Takami et al. |
| 2013/0213803 | A1 | 8/2013 | Sato et al. |
| 2013/0248362 | A1 | 9/2013 | Ogino et al. |
| 2013/0292245 | A1 | 11/2013 | Ikeda et al. |
| 2013/0306470 | A1 | 11/2013 | Ogino et al. |
| 2014/0083847 | A1 | 3/2014 | Sato |
| 2014/0231250 | A1 | 8/2014 | Ogino et al. |
| 2014/0311902 | A1 | 10/2014 | Ogino et al. |
| 2014/0346039 | A1 | 11/2014 | Ogino |
| 2014/0360871 | A1 | 12/2014 | Sato et al. |
| 2015/0021175 | A1 | 1/2015 | Arakawa et al. |
| 2015/0060268 | A1 | 3/2015 | Ogino |
| 2015/0107411 | A1 | 4/2015 | Ogino |
| 2015/0107991 | A1 | 4/2015 | Sato |
| 2015/0213822 | A1 | 7/2015 | Ogino |
| 2016/0237552 | A1 | 8/2016 | Arakawa |
| 2017/0294203 | A1 | 10/2017 | Ogino |
| 2018/0005807 | A1 | 1/2018 | Ogino et al. |
| 2018/0019389 | A1 | 1/2018 | Arakawa |

FOREIGN PATENT DOCUMENTS

| | | |
|---|---|---|
| WO | 2014/185266 A1 | 4/2014 |
| WO | 2014/141737 A1 | 9/2014 |

OTHER PUBLICATIONS

"Iron (III) oxide" [https://en.wikipedia.org/wiki/Iron(III)_oxide].*
Derwent Abstract EP 1895518 A1 (Year: 2008).*

* cited by examiner

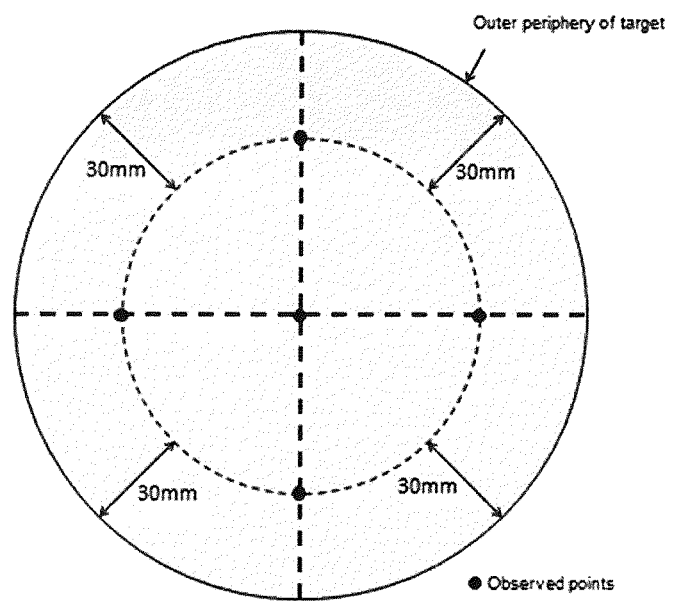

SPUTTERING TARGET FOR MAGNETIC RECORDING MEDIUM, AND MAGNETIC THIN FILM

BACKGROUND

The present invention relates to a sputtering target suitable for forming a magnetic thin film in a magnetic recording medium, and in particular to a sputtering target having a structure in which a nonmagnetic phase is dispersed in a magnetic phase having Fe—Pt as its main components.

In the field of magnetic recording as represented with hard disk drives, a vertical magnetic recording system, in which the easy axis of magnetization is aligned in a vertical direction relative to the recording surface, has been put into practical application. In particular, with a hard disk medium adopting the vertical magnetic recording system, in order to achieve higher recording density and reduce noise, a granular structured-type magnetic thin film has been developed. The thin film has a structure in which magnetic crystal grains aligned in a vertical direction are surrounded with nonmagnetic materials so as to reduce the magnetic interaction between the magnetic grains.

For the foregoing magnetic crystal grains, a ferromagnetic alloy having Fe—Pt as its main components is used; and for the nonmagnetic material, carbon and its compound, boron and its compound, metal oxides or the like are used. This kind of granular structured-type magnetic thin film is prepared by sputtering a target, which has a structure in which a nonmagnetic phase is dispersed in a magnetic phase, on a substrate by using a magnetron sputtering device.

However, in the sputter process, there is a problem that attachments referred to as particles which adhere to the substrate on which a thin film is formed. Many of the particles generated during deposition are known to be the oxides in the target. There are cases where an abnormal discharge is generated on the sputter surface of the target during the sputtering process and where carbon and its compound, boron and its compound, metal oxides or the like drop off from the sputter surface of the target. That is regarded as a cause of the generation of the particle.

Various technologies are known in relation to sputtering targets having a structure in which a nonmagnetic phase configured from carbon and its compound, boron and its compound, metal oxides or the like is dispersed in a magnetic phase configured from a metal, and production methods thereof (for instance, Patent Documents 1 to 5). For example, Patent Document 1 discloses the way to suppress the aggregation of oxide, to refine the target structure and reduce the generation of particles; namely, by way of mixing raw material in advance with a primary sintered body powder obtained via mixing, sintering, pulvering when mixing and pulverizing raw material powders with a pulverizer like a ball mill.

PRIOR ART DOCUMENTS

Patent Documents

[Patent Document 1] WO 2012/029498 A1
[Patent Document 2] WO 2013/094605 A1
[Patent Document 3] WO 2014/141737 A1
[Patent Document 4] WO 2012/014504 A1
[Patent Document 5] WO 2013/105647 A1

SUMMARY

Generally, when producing a sputtering target in which a nonmagnetic phase configured from carbon and its compound, boron and its compound, metal oxides or the like is dispersed in a metal phase, sometimes components configuring the nonmagnetic phase become aggregated, and sometimes the aggregates cause the generation of particles during the sputtering process. In order to suppress the generation of particles, the foregoing conventional technologies have finely dispersed a nonmagnetic phase configured from carbon and its compound, boron and its compound, metal oxides or the like in a magnetic phase configured from a metal.

Nevertheless, depending on the type of components configuring the nonmagnetic phase, the components would still cause the generation of particles even when they are finely dispersed. Also, because the floating quantity of the magnetic head becomes smaller pursuant to the increase in the recording density of the hard disk drive, the size and number of particles permitted in a magnetic recording medium is being more strictly restricted compared to conventional technologies.

The present invention addresses the issue of providing a sputtering target for a magnetic recording medium capable of considerably reducing the particles that are generated during the sputtering process in light of the foregoing problems. It is thereby possible to deposit a quality magnetic recording layer, and improve the yield of a magnetic recording medium.

As a result of intense study to solve the problem, it was discovered that the addition of oxides having low viscosity will increase the adhesion of the magnetic phase configured from a metal and the nonmagnetic phase configured from carbon and its compound, boron and its compound, metal oxides or the like in the target, to suppress the nonmagnetic phase from dropping off during the sputtering process, and to considerably decrease the generation of particles.

Based on the findings, the present inventors provide the following aspects.

1) A sputtering target containing 0.1 to 10 mol % of one or more types of oxides selected from FeO, $Fe_3O_4$, $K_2O$, $Na_2O$, PbO, and ZnO, 5 to 70 mol % of Pt, and the remainder being Fe.

2) The sputtering target according to 1) above, wherein the sputtering target contains an oxide of one or more types of elements selected from Al, B, Si, and Ti, carbon, boron, boron nitride, and boron carbide in a total amount of 1 to 50 mol %.

3) The sputtering target according to 1) or 2) above, wherein the sputtering target contains 1 to 30 mol % of one or more types selected from Au, Ag, Cu, Ga, Ge, Ir, Mn, Mo, Nb, Ni, Pd, Re, Rh, Ru, Sn, Ta, W, V, and Zn.

4) The sputtering target according to any one of 1) to 3) above, wherein an average area per nonmagnetic grain is 0.1 to 2000 pmt.

5) A film containing 0.1 to 10 mol % of one or more types of oxides selected from FeO, $Fe_3O_4$, $K_2O$, $Na_2O$, PbO, and ZnO, 5 to 70 mol % of Pt, and the remainder being Fe.

6) The film according to 5) above, wherein the film contains an oxide of one or more types of elements selected from Al, B, Si, and Ti, carbon, boron, boron nitride, and boron carbide in a total amount of 1 to 50 mol %.

7) The film according to 5) or 6) above, wherein the film contains 1 to 30 mol % of one or more types selected from Au, Ag, Cu, Ga, Ge, Ir, Mn, Mo, Nb, Ni, Pd, Re, Rh, Ru, Sn, Ta, W, V, and Zn.

The sputtering target of the present invention yields a superior effect of being able to reduce the amount of particles generated during the sputtering process, and improve the yield during deposition. Moreover, in a magnetic thin film deposited via sputtering, improvement of device characteristics can be expected because it becomes easier to form a grain boundary of a nonmagnetic phase so as to surround the magnetic grains.

BRIEF DESCRIPTION OF THE DRAWINGS

This FIGURE is a schematic diagram showing the observed points of the nonmagnetic phase in the sputtering target according to the present invention.

DETAILED DESCRIPTION

The present invention is characterized by adding a material capable of lower the viscosity of the nonmagnetic phase (i.e., low-viscosity oxide) in a sintered sputtering target configured from a magnetic phase having Fe—Pt as its main components and a nonmagnetic phase. By the addition, it is possible to improve the adhesion of the magnetic phase and the nonmagnetic phase in the sputtering target, and considerably reduce the generation of particles during the sputtering process caused by the nonmagnetic phase (carbon and its compound, boron and its compound, metal oxides or the like) dropping off from the sputtering target.

As a material capable of reducing the viscosity of the nonmagnetic phase, i.e. as a low-viscosity oxide, preferably used is an oxide of one of more types selected from FeO, $Fe_3O_4$, $K_2O$, $Na_2O$, PbO, and ZnO. As a result of simulation, the viscosities of FeO, $Fe_3O_4$, $K_2O$, $Na_2O$, PbO, and ZnO at 1000° C. are $1.8 \times 10^{-1}$, $3.0 \times 10^{-1}$, $4.7 \times 10^{-2}$, $2.9 \times 10^{-2}$, $3.2 \times 10^{-2}$, and $3.2 \times 10^{-1}$ poise, respectively, and in all cases the viscosity at 1000° C. is a sufficiently low viscosity at less than 1.0 poise. By way of reference, the viscosities of CaO, MgO, and NiO at 1000° C. are relatively high values at $2.1 \times 10^{1}$, $1.6 \times 10^{1}$, and $1.8 \times 10^{0}$ poise, respectively.

Moreover, the oxides of one of more types selected from FeO, $Fe_3O_4$, $K_2O$, $Na_2O$, PbO, and ZnO are preferably added in a total amount of 0.1 mol % or more and 10 mol % or less in the sputtering target. When the amount of low-viscosity oxides is less than 0.1 mol %, it is difficult to yield the effect of improving adhesion, and when the amount of low-viscosity exceeds 10 mol %, it may not be possible to obtain the intended magnetic properties. Furthermore, in order to improve the adhesion, the amount of these oxides is more preferably 0.1 mol % or more and 5 mol % or less. Moreover, in order to improve magnetic properties, other oxides may also be included.

As components of the magnetic phase in a sputtering target of the present invention, in the least a metal having a composition containing Fe and Pt may be used. Preferably, a metal containing 5 mol % or more and 70 mol % or less of Pt and the remainder being Fe may be used. Moreover, in order to improve magnetic properties, other metals may also be included. Note that the composition range of the magnetic phase described above is a molar fraction relative to the composition obtained by subtracting the composition of the nonmagnetic phase from the overall composition of the sputtering target.

So as long as the components of the magnetic phase are able to obtain sufficient properties as a magnetic thin film, the composition may be suitably adjusted within the foregoing range. Note that the unavoidable impurities included in the sputtering target will never yield a significant change in the adhesion of the magnetic phase configured from a metal and the nonmagnetic phase configured from carbon and its compound, boron and its compound, metal oxides or the like. Accordingly, whether or not the sputtering target satisfies the composition range of the present invention may be considered irrespective of the inclusion of such unavoidable impurities.

The sputtering target of the present invention preferably contains, as a nonmagnetic phase, carbon, boron, boron nitride, boron carbide, and an oxide having one or more types of Al, B, Si, and Ti as its structural component in a total amount of 1 to 50 mol %. A standard vertical magnetic recording film contains, as a nonmagnetic phase, carbon, boron, boron nitride, boron carbide, and an oxide having one or more types of Al, B, Si, and Ti as its structural component. Here, the functions as a vertical magnetic recording film are exhibited by forming a grain boundary of a nonmagnetic phase so as to surround the magnetic grains in a magnetic thin film which is deposited via sputtering. By adding the foregoing material which reduces the viscosity to the nonmagnetic phase, the grain boundary of the nonmagnetic phase will become more adhered to the magnetic grains, and improvement in the device characteristics can be expected.

Moreover, the sputtering target of the present invention preferably contains a nonmagnetic material, which includes the foregoing oxides (including low-viscosity oxides) and carbides, in an amount of 10% or higher and less than 55%, in terms of volume ratio, in the target. As a result of containing a nonmagnetic material in an amount of 10% or higher and less than 55%, in terms of volume ratio, the magnetic properties of the deposited magnetic thin film can be made even more favorable. When the volume ratio of the nonmagnetic phase is less than 10%, the effect of the nonmagnetic phase blocking the magnetic interaction of the magnetic phases will deteriorate. Meanwhile, when the volume ratio of the nonmagnetic phase is 55% or higher, the dispersibility of the nonmagnetic phase will deteriorate, and there is a problem in that the amount of particles will increase.

According to the sputtering target of the present invention, as a magnetic phase, it may additionally contain, one or more types selected from Au, Ag, Cu, Ga, Ge, Ir, Mn, Mo, Nb, Ni, Pd, Re, Rh, Ru, Sn, Ta, W, V, and Zn in the sputtering target in an amount of 1 mol % or more and 30 mol % or less. It is thereby possible to improve the magnetic properties of the magnetic thin film. Note that these metals are mainly included in the magnetic phase, in certain cases some of these metals may be included in the nonmagnetic phase as a result of becoming oxidized during the sintering process.

In the structure of the sputtering target of the present invention, the average area per nonmagnetic grain in the metal magnetic phase (matrix) is preferably within a range of 0.1 to 2000 $\mu m^2$. It is thereby possible to reduce the generation of particles caused by the oxides during the sputtering process. The nonmagnetic grains contain not only contain low-viscosity oxides, but also other carbides and other nonmagnetic phases. When the average area is greater than 2000 $\mu m^2$, grains of coarse metal oxides may become the origin of arcing during the sputtering process, which may in turn increase the particles. Meanwhile, when the average area per grain is smaller than 0.1 $\mu m^2$, it is necessary to pulverize the raw material powders to realize the foregoing structure. However, there is a problem of making the production process complicated. The average area per nonmagnetic grains obtained by observing 5 points in the plane as shown in FIG. 1 and taking the average thereof in order to reduce variations depending on the observed points.

The method of measuring nonmagnetic grains and the method of calculating the average area in the Examples and Comparative Examples are now explained in detail.

Method of Measuring Nonmagnetic Phase
  Device: Color 3D laser microscope VK-9700 manufactured by Keyence
  Software: VK Analyzer (included with the device)
Method of Obtaining Average Area of Nonmagnetic Grains In measuring the nonmagnetic particles, an enlarged image taken with the foregoing laser microscope is used. A laser microscope image of a structure in which nonmagnetic particles configured from carbon or its compound, boron or its compound, a metal oxide or the like are dispersed in a magnetic phase configured from metal component is able to clearly differentiate the boundary of the magnetic phase part configured from a metal component and the nonmagnetic phase part configured from carbon or its compound, boron or its compound, a metal oxide or the like based on the contrast difference of the two. The average area of the nonmagnetic grains surrounded by the boundary is calculated with the foregoing software.

Specifically, a structure image of 5 in-plane points of the sintered body (sputtering target) is observed as shown in FIG. 1. The points are 1 center point, 1 arbitrary point that is 30 mm inside from the outer periphery, and 3 points obtained by rotating the foregoing point at 90°, 180°, and 270° with the center of the target as the center of rotation) is observed in a visual field of 216 μm×288 μm.

Subsequently, the obtained structure images are converted into binarized images. The threshold upon performing the binarization is set between the color tone differences at the boundary of the magnetic phase part configured from a metal component and the nonmagnetic phase part configured from carbon or its compound, boron or its compound, a metal oxide or the like. While the color tone difference at the boundary of the magnetic phase and the nonmagnetic grains in a laser microscope image, in which nonmagnetic grains configured from carbon or its compound, boron or its compound, a metal oxide or the like are dispersed in a magnetic phase (matrix) configured from a metal component, is normally evident, in certain cases the sharpness of separation of the two can be improved by concurrently using processes such as the discriminant analysis method and the differential histogram method.

In the binarized image of each structure image, the nonmagnetic grains that are in contact with the edge of the image are excluded from the software calculation at this stage in order to prevent the average area of the nonmagnetic grains in each structure image from being undercalculated. Next, the average value of the area of nonmagnetic grains in each structure image is calculated. The average of 5 points is thereafter taken regarding the area of nonmagnetic grains in each of the observed points, and used as the average area per nonmagnetic grains.

The magnetic thin film that is prepared using the sputtering target of the present invention is characterized in containing 0.1 to 10 mol % of an oxide of one or more types selected from FeO, $Fe_3O_4$, $K_2O$, $Na_2O$, PbO, and ZnO, 5 to 70 mol % of Pt, and the remainder being Fe. Moreover, the magnetic thin film is further characterized in containing an oxide of one or more types of elements selected from Al, B, Si, and Ti, carbon, boron, boron nitride, and boron carbide in a total amount of 1 to 50 mol % in addition to the foregoing component composition. Furthermore, the magnetic thin film is further characterized in containing 1 to 30 mol % of one or more types of elements selected from Au, Ag, Cu, Ga, Ge, Ir, Mn, Mo, Nb, Ni, Pd, Re, Rh, Ru, Sn, Ta, W, V, and Zn in addition to the foregoing component composition. By adding the foregoing low-viscosity oxides, the grain boundary of the nonmagnetic phase will become more adhered to the magnetic grains, and improvement in the device characteristics can also be expected.

The sputtering target of the present invention can be produced by adopting the powder sintering method, for instance, based on the following process. Foremost, an Fe powder and a Pt powder are prepared as the metal powders; and such metal powders as a Au powder, a Ag powder, a Cu powder, and a Ga powder described above may also be prepared as needed. As the metal powders, alloy powders may also be used in addition to the metal powders of single elements. The grain size of these metal powders is desirably within a range of 1 to 10 μm. When the grain size is 1 to 10 μm, more uniform mixing is possible, and segregation and coarse crystallization can be prevented. When the grain size of the metal powders is greater than 10 μm, there are cases where the nonmagnetic grains are not dispersed uniformly. Meanwhile, when the grain size of the metal powders is smaller than 1 μm, there are problems in that the composition of the target may deviate from the intended composition due to the influence of oxidation of the metal powders. Nevertheless, this grain size range is merely a preferred range, and it should be naturally understood that any deviation from the foregoing range is not a condition that denies the present invention.

An FeO powder, an $Fe_3O_4$ powder, a $K_2O$ powder, a $Na_2O$ powder, a PbO powder, and a ZnO powder are prepared as the oxide powders; and an $Al_2O_3$ powder, a $B_2O_3$ powder, a $SiO_2$ powder, and a $TiO_2$ powder described above are also prepared. In addition to the oxide powders, a C powder, a B powder, a BN powder, and a $B_4C$ powder are prepared as needed.

The grain size of the oxide powders is preferably within a range of 1 to 30 μm. When the grain size is 1 to 30 μm, it becomes more difficult for the nonmagnetic powders to become aggregated when mixed with the foregoing metal powders, and the nonmagnetic powders can be more uniformly dispersed. Meanwhile, when the average grain size of the nonmagnetic powders is greater than 30 μm, there are cases where coarse nonmagnetic grains are generated after the sintering process, and, when the grain size of the nonmagnetic grains is smaller than 1 μm, the oxide powders tend to become aggregated. Moreover, the raw material powders of the C powder, the B powder, the BN powder, and the $B_4C$ powder preferably have a grain size within a range of 1 to 100 μm.

Nevertheless, this grain size range is merely a preferred range, and it should be naturally understood that any deviation from the foregoing range is not a condition that denies the present invention.

Subsequently, the foregoing raw material powders are weighed to achieve the intended composition, and mixed and pulverized using a known means such as a ball mill. Here, it is desirable to seal inert gas in the pulverization vessel to suppress oxidation of the raw material powders as much as possible.

Next, the thus obtained mixed powder is molded and sintered via the hot press method in a vacuum atmosphere or an inert gas atmosphere. Moreover, in addition to the hot press method, various other pressing sintering methods, such as the plasma discharge sintering method, may also be used. In particular, the hot isostatic sintering method is effective for improving the density of the sintered body. While this also depends on the structural components of the target, the holding temperature during the sintering process is often set to be within a temperature range of 700 to 1500° C.

By processing the thus obtained sintered body into an intended shape by using a lathe, the sputtering target of the present invention can be produced.

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Examples 1 to 6: Nonmagnetic Phase C, Etc.

Prepared were an Fe powder and a Pt powder as magnetic materials, and a C powder as a nonmagnetic material, and an FeO powder, an $Fe_3O_4$ powder, a $K_2O$ powder, Na $a_2O$ powder, a PbO powder, and a ZnO powder as low-viscosity oxides. These powders were subsequently weighed to achieve the composition ratios shown in Table 1.

Next, for each of Examples 1 to 6, the weighed powders were respectively placed in a ball mill pot having a capacity of 10 liters together with zirconium balls as the pulverizing medium, and mixed by rotating the ball mill pot for 24 hours. The mixed powder removed from the ball mill was filled in a carbon mold having a diameter of 190 mm, and sintered via hot press. The hot press conditions were as follows: namely, vacuum atmosphere, rate of temperature increase of 300° C./hour, holding temperature of 1050° C., and holding time of 2 hours, and a pressure of 30 MPa was applied from the start of temperature increase to the end of holding. After the end of holding, the resultant product was naturally cooled as is in the chamber.

Next, for each of Examples 1 to 6, the cross section of the prepared sintered body was polished and the structure was observed with a microscope, and a structure in which a nonmagnetic phase is dispersed in a magnetic phase was confirmed. Furthermore, a structure image of 5 points on the observed surface was photographed in a visual field size of 216 μm×288 μm. The photographed images were binarized with image processing software, the number and area of the parts corresponding to the nonmagnetic phase (black parts of the structure observation image) were obtained, and the average area per nonmagnetic grain was thereby calculated. The results are shown in Table 1.

Next, the respective sintered bodies of Examples 1 to 6 were machined with a lathe into a shape having a diameter of 180.0 mm and a thickness of 5.0 mm to prepare a disk-shaped target. Each of the prepared disk-shaped targets was mounted on a magnetron sputtering device (C-3010 sputtering system manufactured by Canon Anelva), and then sputtered. The sputtering conditions were as follows; namely, after performing 2 kWhr pre-sputtering at an applied power of 1 kW and Ar gas pressure of 1.7 Pa, a film was deposited on a silicon substrate having a diameter of 4 inches for 20 seconds. Subsequently, the number of particles having a size of 0.25 to 3 μm that became adhered on the substrate was measured using a particle counter for each of Examples 1 to 6. As the result shown in Table 1, the number of particles decreased significantly compared to the Comparative Examples described later.

[Table 1]

|  | Sputtering Target Composition (Ratio of Number of Molecules) | Mean Area of Oxide Particles [μm²/particle] | Number of Particles in Steady State [particles/wafer] |
|---|---|---|---|
| Example 1 | 30Fe—28Pt—40C—2FeO | 277 | 17 |
| Example 2 | 30Fe—28Pt—40C—2Fe3O4 | 9 | 8 |
| Example 3 | 30Fe—28Pt—40C—2K2O | 217 | 11 |
| Example 4 | 30Fe—28Pt—40C—2Na2O | 553 | 18 |
| Example 5 | 30Fe—28Pt—40C—2PbO | 127 | 7 |
| Example 6 | 30Fe—28Pt—40C—2ZnO | 717 | 20 |
| Example 7 | 10Fe—69Pt—18B—3FeO | 56 | 18 |
| Example 8 | 10Fe—69Pt—18B—3Fe3O4 | 104 | 11 |
| Example 9 | 10Fe—69Pt—18B—3K2O | 17 | 18 |
| Example 10 | 10Fe—69Pt—18B—3Na2O | 461 | 6 |
| Example 11 | 10Fe—69Pt—18B—3PbO | 747 | 14 |
| Example 12 | 10Fe—69Pt—18B—3ZnO | 163 | 5 |
| Example 13 | 51Fe—19Pt—29BN—1FeO | 511 | 20 |
| Example 14 | 51Fe—19Pt—29BN—1Fe3O4 | 568 | 7 |
| Example 15 | 51Fe—19Pt—29BN—1K2O | 52 | 15 |
| Example 16 | 51Fe—19Pt—29BN—1Na2O | 440 | 17 |
| Example 17 | 51Fe—19Pt—29BN—1PbO | 175 | 11 |
| Example 18 | 51Fe—19Pt—29BN—1ZnO | 694 | 10 |
| Example 19 | 31Fe—57Pt—8B4C—4FeO | 216 | 17 |
| Example 20 | 31Fe—57Pt—8B4C—4Fe3O4 | 301 | 9 |
| Example 21 | 31Fe—57Pt—8B4C—4K2O | 455 | 12 |
| Example 22 | 31Fe—57Pt—8B4C—4Na2O | 83 | 11 |
| Example 23 | 31Fe—57Pt—8B4C—4PbO | 380 | 15 |
| Example 24 | 31Fe—57Pt—8B4C—4ZnO | 134 | 11 |
| Example 25 | 50Fe—40Pt—7Al2O3—3FeO | 651 | 11 |
| Example 26 | 50Fe—40Pt—7Al2O3—3Fe3O4 | 51 | 14 |
| Example 27 | 50Fe—40Pt—7Al2O3—3K2O | 719 | 19 |
| Example 28 | 50Fe—40Pt—7Al2O3—3Na2O | 457 | 15 |
| Example 29 | 50Fe—40Pt—7Al2O3—3PbO | 171 | 11 |
| Example 30 | 50Fe—40Pt—7Al2O3—3ZnO | 455 | 5 |
| Example 31 | 68Fe—27Pt—3B2O3—2FeO | 549 | 16 |
| Example 32 | 68Fe—27Pt—3B2O3—2Fe3O4 | 380 | 14 |
| Example 33 | 68Fe—27Pt—3B2O3—2K2O | 770 | 16 |
| Example 34 | 68Fe—27Pt—3B2O3—2Na2O | 15 | 5 |
| Example 35 | 68Fe—27Pt—3B2O3—2PbO | 45 | 10 |
| Example 36 | 68Fe—27Pt—3B2O3—2ZnO | 363 | 6 |

-continued

| | Sputtering Target Composition (Ratio of Number of Molecules) | Mean Area of Oxide Particles [μm²/particle] | Number of Particles in Steady State [particles/wafer] |
|---|---|---|---|
| Example 37 | 45Fe—45Pt—5SiO2—5FeO | 226 | 12 |
| Example 38 | 45Fe—45Pt—5SiO2—5Fe3O4 | 780 | 17 |
| Example 39 | 45Fe—45Pt—5SiO2—5K2O | 531 | 19 |
| Example 40 | 45Fe—45Pt—5SiO2—5Na2O | 257 | 15 |
| Example 41 | 45Fe—45Pt—5SiO2—5PbO | 322 | 12 |
| Example 42 | 45Fe—45Pt—5SiO2—5ZnO | 192 | 10 |
| Example 43 | 28Fe—62Pt—6TiO2—4FeO | 783 | 15 |
| Example 44 | 28Fe—62Pt—6TiO2—4Fe3O4 | 41 | 11 |
| Example 45 | 28Fe—62Pt—6TiO2—4K2O | 228 | 19 |
| Example 46 | 28Fe—62Pt—6TiO2—4Na2O | 380 | 17 |
| Example 47 | 28Fe—62Pt—6TiO2—4PbO | 482 | 12 |
| Example 48 | 28Fe—62Pt—6TiO2—4ZnO | 444 | 8 |
| Example 49 | 28Fe—28Pt—2Au—40C—2FeO | 260 | 19 |
| Example 50 | 10Fe—64Pt—5Ag—18B—3Fe3O4 | 472 | 12 |
| Example 51 | 29Fe—19Pt—22Cu—29BN—1K2O | 74 | 11 |
| Example 52 | 31Fe—49Pt—8Ge—8B4C—4Na2O | 581 | 8 |
| Example 53 | 50Fe—30Pt—10Pd—7Al2O3—3PbO | 713 | 17 |
| Comparative Example 1 | 30Fe—28Pt—42C | 324 | 51 |
| Comparative Example 2 | 30Fe—28Pt—40C—2CaO | 145 | 68 |
| Comparative Example 3 | 30Fe—28Pt—40C—2MgO | 31 | 54 |
| Comparative Example 4 | 30Fe—28Pt—40C—2NiO | 242 | 46 |
| Comparative Example 5 | 10Fe—69Pt—21B | 290 | 156 |
| Comparative Example 6 | 51Fe—19Pt—30BN | 189 | 125 |
| Comparative Example 7 | 31Fe—57Pt—12B4C | 319 | 181 |
| Comparative Example 8 | 50Fe—40Pt—10Al2O3 | 97 | 84 |
| Comparative Example 9 | 68Fe—27Pt—5B2O3 | 246 | 67 |
| Comparative Example 10 | 45Fe—45Pt—10SiO2 | 62 | 64 |
| Comparative Example 11 | 28Fe—62Pt—10TiO2 | 77 | 152 |

Examples 7 to 12: Nonmagnetic Phase B, Etc

Prepared were an Fe powder and a Pt powder as magnetic materials, a B powder as a nonmagnetic material, and an FeO powder, an $Fe_3O_4$ powder, a $K_2O$ powder, Na $a_2O$ powder, a PbO powder, and a ZnO powder as low-viscosity oxides. These powders were weighed to achieve the composition ratios shown in Table 1. Next, for each of Examples 7 to 12, a sintered body was produced by the same method as in Examples 1 to 6. The cross section of the obtained sintered bodies was observed with a microscope in the same manner as Examples 1 to 6, and a structure in which a nonmagnetic phase is dispersed in a magnetic phase was confirmed. Moreover, for each of Examples 7 to 12, the average area per nonmagnetic grain was calculated in the same manner as Examples 1 to 6. The results are shown in Table 1. Next, the respective sintered bodies of Examples 7 to 12 were sputtered and the number of particles was measured in the same manner as Examples 1 to 6. As the result shown in Table 1, the number of particles decreased significantly compared to the Comparative Examples described later.

Examples 13 to 18: Nonmagnetic Phase BN, Etc.

Prepared were an Fe powder and a Pt powder as magnetic materials; a BN powder as a nonmagnetic material, and an FeO powder, an $Fe_3O_4$ powder, a $K_2O$ powder, Na $a_2O$ powder, a PbO powder, and a ZnO powder as low-viscosity oxides. These powders were weighed to achieve the composition ratios shown in Table 1. Next, for each of Examples 13 to 18, a sintered body was produced by the same method as in Examples 1 to 6. The cross section of the obtained sintered bodies was observed with a microscope in the same manner as Examples 1 to 6, and a structure in which a nonmagnetic phase is dispersed in a magnetic phase was confirmed. Moreover, for each of Examples 13 to 18, the average area per nonmagnetic grain was calculated in the same manner as Examples 1 to 6. The results are shown in Table 1. Next, the respective sintered bodies of Examples 13 to 18 were sputtered and the number of particles was measured in the same manner as Examples 1 to 6. As the result shown in Table 1, the number of particles decreased significantly compared to the Comparative Examples described later.

Examples 19 to 24: Nonmagnetic Phase $B_4C$, Etc.

Prepared were an Fe powder and a Pt powder as magnetic materials, a $B_4C$ powder as a nonmagnetic material, and an FeO powder, an $Fe_3O_4$ powder, a $K_2O$ powder, Na $a_2O$ powder, a PbO powder, and a ZnO powder as low-viscosity oxides. These powders were weighed to achieve the composition ratios shown in Table 1. Next, for each of Examples 19 to 24, a sintered body was produced by the same method as in Examples 1 to 6. The cross section of the obtained sintered bodies was observed with a microscope in the same manner as Examples 1 to 6, and a structure in which a nonmagnetic phase is dispersed in a magnetic phase was confirmed. Moreover, for each of Examples 19 to 24, the average area per nonmagnetic grain was calculated in the same manner as Examples 1 to 6. The results are shown in Table 1. Next, the respective sintered bodies of Examples 19 to 24 were sputtered and the number of particles was measured in the same manner as Examples 1 to 6. As the result shown in Table 1, the number of particles decreased significantly compared to the Comparative Examples described later.

Examples 25 to 30: Nonmagnetic Phase $Al_2O_3$, Etc.

Prepared were an Fe powder and a Pt powder as magnetic materials, an $Al_2O_3$ powder as a nonmagnetic material, and an FeO powder, an $Fe_3O_4$ powder, a $K_2O$ powder, Na $a_2O$ powder, a PbO powder, and a ZnO powder as low-viscosity oxides. These powders were weighed to achieve the composition ratios shown in Table 1. Next, for each of Examples 25 to 30, a sintered body was produced by the same method as in Examples 1 to 6. The cross section of the obtained sintered bodies was observed with a microscope in the same manner as Examples 1 to 6, and a structure in which a nonmagnetic phase is dispersed in a magnetic phase was confirmed. Moreover, for each of Examples 25 to 30, the average area per nonmagnetic grain was calculated in the same manner as Examples 1 to 6. The results are shown in Table 1. Next, the respective sintered bodies of Examples 25 to 30 were sputtered and the number of particles was measured in the same manner as Examples 1 to 6. As the result shown in Table 1, the number of particles decreased significantly compared to the Comparative Examples described later.

Examples 31 to 36: Nonmagnetic Phase $B_2O_3$, Etc.

Prepared were an Fe powder and a Pt powder as magnetic materials, a $B_2O_3$ powder as a nonmagnetic material, and an FeO powder, an $Fe_3O_4$ powder, a $K_2O$ powder, Na $a_2O$ powder, a PbO powder, and a ZnO powder as low-viscosity oxides. These powders were weighed to achieve the composition ratios shown in Table 1. Next, for each of Examples 31 to 36, a sintered body was produced by the same method as in Examples 1 to 6. The cross section of the obtained sintered bodies was observed with a microscope in the same manner as Examples 1 to 6, and a structure in which a nonmagnetic phase is dispersed in a magnetic phase was confirmed. Moreover, for each of Examples 31 to 36, the average area per nonmagnetic grain was calculated in the same manner as Examples 1 to 6. The results are shown in Table 1. Next, the respective sintered bodies of Examples 31 to 36 were sputtered and the number of particles was measured in the same manner as Examples 1 to 6. As the result shown in Table 1, the number of particles decreased significantly compared to the Comparative Examples described later.

Examples 37 to 42: Nonmagnetic Phase $SiO_2$, Etc.

Prepared were an Fe powder and a Pt powder as magnetic materials, a $SiO_2$ powder as a nonmagnetic material, and an FeO powder, an $Fe_3O_4$ powder, a $K_2O$ powder, Na $a_2O$ powder, a PbO powder, and a ZnO powder as low-viscosity oxides. These powders were weighed to achieve the composition ratios shown in Table 1. Next, for each of Examples 37 to 42, a sintered body was produced by the same method as in Examples 1 to 6. The cross section of the obtained sintered bodies was observed with a microscope in the same manner as Examples 1 to 6, and a structure in which a nonmagnetic phase is dispersed in a magnetic phase was confirmed. Moreover, for each of Examples 37 to 42, the average area per nonmagnetic grain was calculated in the same manner as Examples 1 to 6. The results are shown in Table 1. Next, the respective sintered bodies of Examples 37 to 42 were sputtered and the number of particles was measured in the same manner as Examples 1 to 6. As the result shown in Table 1, the number of particles decreased significantly compared to the Comparative Examples described later.

Examples 43 to 48: Nonmagnetic Phase $TiO_2$, Etc.

Prepared were an Fe powder and a Pt powder as magnetic materials, a $TiO_2$ powder as a nonmagnetic material, and an FeO powder, an $Fe_3O_4$ powder, a $K_2O$ powder, Na $a_2O$ powder, a PbO powder, and a ZnO powder as low-viscosity oxides. These powders were weighed to achieve the composition ratios shown in Table 1. Next, for each of Examples 43 to 48, a sintered body was produced by the same method as in Examples 1 to 6. The cross section of the obtained sintered bodies was observed with a microscope in the same manner as Examples 1 to 6, and a structure in which a nonmagnetic phase is dispersed in a magnetic phase was confirmed. Moreover, for each of Examples 43 to 48, the average area per nonmagnetic grain was calculated in the same manner as Examples 1 to 6. The results are shown in Table 1. Next, the respective sintered bodies of Examples 43 to 48 were sputtered and the number of particles was measured in the same manner as Examples 1 to 6. As the result shown in Table 1, the number of particles decreased significantly compared to the Comparative Examples described later.

Examples 49 to 53: Addition of Metal Element

Prepared were an Fe powder and a Pt powder as magnetic materials, a Au powder, a Ag powder, a Cu powder, a Ge powder, and a Pd powder as additional additive components, a C powder, a B powder, a BN powder, a $B_4C$ powder, and an $Al_2O_3$ powder as nonmagnetic materials, and an FeO powder, an $Fe_3O_4$ powder, a $K_2O$ powder, Na $a_2O$ powder, and a PbO powder as low-viscosity oxides. These powders were weighed to achieve the composition ratios shown in Table 1. Next, for each of Examples 49 to 53, a sintered body was produced by the same method as in Examples 1 to 6. The cross section of the obtained sintered bodies was observed with a microscope in the same manner as Examples 1 to 6, and a structure in which a nonmagnetic phase is dispersed in a magnetic phase was confirmed. Moreover, for each of Examples 49 to 53, the average area per nonmagnetic grain was calculated in the same manner as Examples 1 to 6. The results are shown in Table 1. Next, the respective sintered bodies of Examples 49 to 53 were sputtered and the number of particles was measured in the same manner as Examples 1 to 6. As the result shown in Table 1, the number of particles decreased significantly compared to the Comparative Examples described later.

Comparative Examples 1 to 4: Nonmagnetic Phase C, No Low-Viscosity Oxide

Prepared were an Fe powder and a Pt powder as magnetic materials, and a C powder, a CaO powder, a MgO powder, and a NiO powder as nonmagnetic materials. These powders were weighed to achieve the composition ratios shown in Table 1. Next, for each of Comparative Examples 1 to 4, a sintered body was produced by the same method as in Examples 1 to 6. With regard to the sintered bodies obtained in each of Comparative Examples 1 to 4, the average area per nonmagnetic grain was calculated in the same manner as Examples 1 to 6. The results are shown in Table 1. Next, the respective sintered bodies of Comparative Examples 1 to 4 were sputtered and the number of particles was measured in the same manner as Examples 1 to 6. As the result shown in Table 1, the number of particles considerably increased in comparison to the Examples.

Comparative Examples 5 to 11: Nonmagnetic Phase B, BN, $Al_2O_3$, Etc., No Low-Viscosity Oxide Prepared were an Fe powder and a Pt powder as magnetic materials, and a B powder, a BN powder, a $B_4C$ powder, an Al$_2$O$_3$ powder, a B2O3 powder, a SiO$_2$ powder, and a TiO$_2$ powder as nonmagnetic materials. These powders were weighed to achieve the composition ratios shown in Table 1. Next, for each of Comparative Examples 5 to 11, a sintered body was produced by the same method as in Examples 1 to 6. With regard to the sintered bodies obtained in each of Comparative Examples 5 to 11, the average area per nonmagnetic grain was calculated in the same manner as Examples 1 to 6. The results are shown in Table 1. Next, the respective sintered bodies of Comparative Examples 5 to 11 were sputtered and the number of particles was measured in the same manner as Examples 1 to 6. As the result shown in Table 1, the number of particles increased significantly compared to the Examples.

The sputtering target of the present invention yields a superior effect of being able to reduce the amount of particles generated during the sputtering process, and improve the yield during deposition. Accordingly, the present invention is effective as a sputtering target for forming a magnetic thin film of a magnetic recording medium as represented with hard disk drives.

The invention claimed is:

1. A sputtering target consisting of 0.1 to 5 mol % of one or more oxides selected from the group consisting of FeO, Fe$_3$O$_4$, K$_2$O, Na$_2$O, PbO, and ZnO as a low-viscosity oxide, 1 to 50 mol % of boron carbide as a non-magnetic phase, 1 to 30 mol % of one or more elements selected from the group consisting of Ga, Ge, Ir, Re, Rh, and Zn, 5 to 70 mol % of Pt, and the remainder being Fe, wherein the sputtering target is a sintered body.

2. The sputtering target according to claim 1, wherein at least one of the low-viscosity oxide or the non-magnetic phase exists as nonmagnetic particles within the sputtering target, and wherein an average area per nonmagnetic particle is 0.1 to 2000 μm$^2$.

3. The sputtering target according to claim 1, wherein the low-viscosity oxide exists as nonmagnetic particles within the sputtering target, and wherein an average area per nonmagnetic particle is 0.1 to 2000 μm$^2$.

4. A film produced by a process using the sputtering target according to claim 1.

* * * * *